(12) United States Patent
Akita et al.

(10) Patent No.: US 6,893,794 B2
(45) Date of Patent: May 17, 2005

(54) CHEMICAL AMPLIFICATION TYPE POSITIVE RESIST COMPOSITION

(75) Inventors: Makoto Akita, Kusatsu (JP); Satoshi Yamaguchi, Toyonaka (JP)

(73) Assignee: Sumitomo Chemical Company, Limited, Osaka (JP)

( * ) Notice: Subject to any disclaimer, the term of this patent is extended or adjusted under 35 U.S.C. 154(b) by 0 days.

(21) Appl. No.: 10/622,692

(22) Filed: Jul. 21, 2003

(65) Prior Publication Data

US 2004/0018445 A1 Jan. 29, 2004

(30) Foreign Application Priority Data

Jul. 25, 2002 (JP) ..................................... 2002-216355
Oct. 25, 2002 (JP) ..................................... 2002-311246

(51) Int. Cl.$^7$ ............................................. G03F 7/004
(52) U.S. Cl. ..................... 430/270.1; 430/905; 430/910
(58) Field of Search ............................. 430/270.1, 905, 430/910

(56) References Cited

U.S. PATENT DOCUMENTS

| | | | |
|---|---|---|---|
| 6,013,416 A | | 1/2000 | Nozaki et al. |
| 6,692,884 B2 | * | 2/2004 | Fujimori et al. ............ 430/170 |
| 2003/0207201 A1 | * | 11/2003 | Hatakeyama et al. .... 430/270.1 |
| 2003/0224290 A1 | * | 12/2003 | Kobayashi et al. ....... 430/270.1 |

FOREIGN PATENT DOCUMENTS

| | | |
|---|---|---|
| EP | 1 167 349 A1 | 1/2002 |
| EP | 1 225 479 A2 | 7/2002 |
| JP | 2002-49155 A | 2/2002 |

* cited by examiner

Primary Examiner—John S. Chu
(74) Attorney, Agent, or Firm—Birch, Stewart, Kolasch & Birch, LLP

(57) ABSTRACT

A chemical amplification type positive resist composition comprising:

(A) a resin which itself is insoluble or poorly soluble in an alkali aqueous solution but becomes soluble in an alkali aqueous solution by the action of an acid, and which contains a structural unit derived from p-hydroxystyrene and a structural unit represented by the formula (Ia) or (Ib)

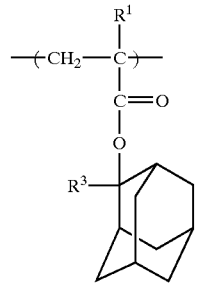

(Ia)

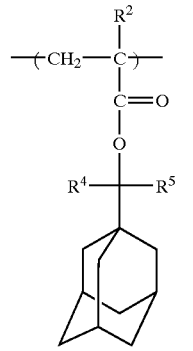

(Ib)

wherein $R^1$ and $R^2$ each independently represents hydrogen or methyl, and $R^3$ to $R^5$ each independently represents alkyl having 1 to 8 carbon atoms; and (B) radiation-sensitive acid generator comprising sulfonic acid ester of N-hydroxyimide compound; and onium salt is provided.

7 Claims, No Drawings

CHEMICAL AMPLIFICATION TYPE POSITIVE RESIST COMPOSITION

BACKGROUND OF THE INVENTION

1. Field of the Invention

The present invention relates to a chemical amplification type resist composition for use in microfabrication of semiconductor.

2. Prior Art

Semiconductor microfabrication employs a lithography process using a resist composition. In lithography, theoretically, the shorter the exposure wavelength becomes, the higher the resolution can be made, as expressed by Rayleigh's diffraction limit formula. The wavelength of an exposure light source for lithography used in the manufacture of semiconductor devices has been shortened year by year as g-line having a wavelength of 436 nm, i-line having a wavelength of 365 nm, KrF excimer laser having a wavelength of 248 nm and ArF excimer laser having a wavelength of 193 nm. $F_2$ excimer laser having a wavelength of 157 nm seems to be promising as the next-generation exposure light source. Further, as the exposure light source of the subsequent generation, soft X ray (EUV) having a wavelength of 13 nm or shorter has been proposed as the exposure light source following the 157 nm-wavelength $F_2$ excimer laser. As a somewhat different type of lithography technology from above, the electron beam lithography has been intensively studied.

As the resists suitable for such light sources, the chemical amplification type resists utilizing chemical amplification effect of acid catalysts have been proposed. When a chemical amplification type resist is radiated, an acid is generated at the radiated part from acid generator in the resist, and then the solubility of the resist at the radiated part to alkali developing solution changes by heat treatment called as post exposure bake, which may hereinafter be abbreviated as PEB, and thereby the resist provides positive or negative patterns.

For a chemical amplification type positive resist, a resin in which an alkali soluble group is protected by a group to be cleaved by the action of an acid is frequently used in combination with an acid generator. It has been reported that high resolution and good dry etching resistance are acquired when a protecting group such as 2-alkyl-2-adamantyl group or 1-adamantyl-1-alkylalkyl group is used as the group to be cleaved by the action of an acid (for example, JP 9-73173-A, S. Takechi et al., J. Photopolym. Sci. Technol., Vol. 9, No. 3, 475–487 (1996) etc.). In addition, a resist for electron beam utilizing a copolymer of 2-methyl-2-adamantyl methacrylate or 2-ethyl-2-adamantyl methacrylate and hydroxystyrene is presented and, in particular, a resist for electron beam utilizing a copolymer of 2-ethyl-2-adamantyl methacrylate and hydroxystyrene has been reported to have high sensitivity, good etching resistance and high resolution in KrF excimer laser exposure (for example, Nozaki et al., J. Photopolym. Sci. Technol., Vol. 13, No. 3, 397–403 (2000)).

In electron beam lithography, however, sensitivity is low and throughput in production of an integrated circuit is problematic when these resists are used as they are. In this respect, it is desired to acquire high sensitivity for resist. However, in general, when sensitivity of resist is enhanced, resolution deteriorates, and smoothness of pattern shape as well as pattern profile (edge roughness) becomes poor. Since large edge roughness of pattern exerts an influence on accuracy of microfabrication, the edge roughness is desired to be smooth. Thus, the results obtained with conventional resists cannot meet desirable performances in sensitivity, resolution, pattern shape and the like.

SUMMARY OF THE INVENTION

An object of the present invention is to provide a chemical amplification type positive resist composition which possesses a high sensitivity and high resolution, gives, in particular, greatly improved line edge roughness and is suitable for electron beam lithography, EUV lithography and the like.

The present invention relates to the followings:

<1> A chemical amplification type positive resist composition comprising:

(A) a resin which itself is insoluble or poorly soluble in an alkali aqueous solution but becomes soluble in an alkali aqueous solution by the action of an acid, and which contains a structural unit derived from p-hydroxystyrene and a structural unit represented by the formula (Ia) or (Ib)

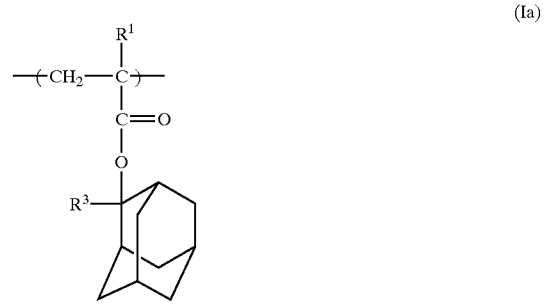

(Ia)

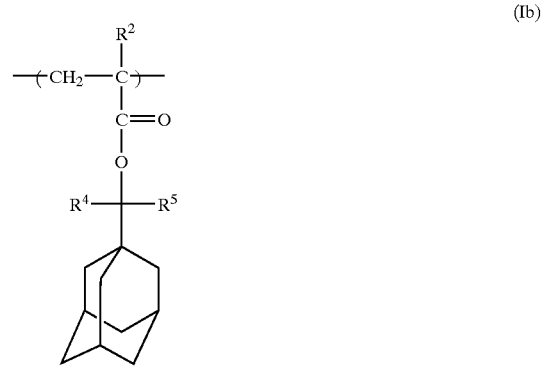

(Ib)

wherein $R^1$ and $R^2$ each independently represents hydrogen or methyl, and $R^3$ to $R^5$ each independently represents alkyl having 1 to 8 carbon atoms; and (B) radiation-sensitive acid generator comprising sulfonic acid ester of N-hydroxyimide compound; and onium salt, which hereinafter referred to as "the present composition".

<2> The composition according to <1>, wherein said sulfonic acid ester of N-hydroxyimide compound is a compound represented by the formula (II):

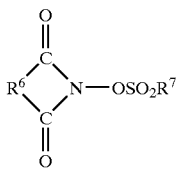
(II)

wherein R6 represents arylene which may be substituted, alkylene which may be substituted or alkenylene which may be substituted, and $R^7$ represents alkyl which may be substituted or aryl which may be substituted.

<3> The composition according to <1> or <2>, wherein said onium salt is a salt represented by the formula (IIIa) or (IIIb):

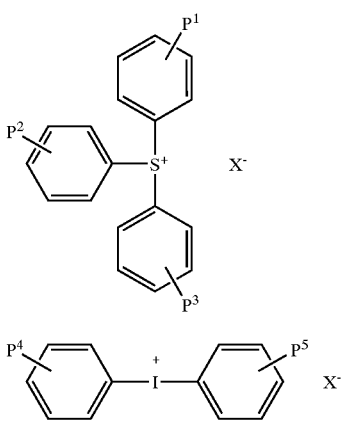

wherein $P^1$ to $P^5$ each independently represents hydrogen, hydroxyl, alkyl having 1 to 6 carbon atoms or alkoxy having 1 to 6 carbon atoms, $X^-$ represents a counter ion.

<4> The composition according to <3>, wherein said counter ion $X^-$ is an ion represented by the following formula (IVa) or (IVb):

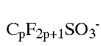
(IVa)

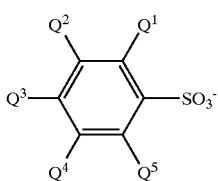
(IVb)

wherein p represents an integer of 1 to 8, and $Q^1$ to $Q^5$ each independently represents hydrogen, hydroxyl, alkyl having 1 to 12 carbon atoms, perfluoroalkyl having 1 to 12 carbon atoms, alkoxy having 1 to 12 carbon atoms, electron-withdrawing group, or a group represented by the formula (V):

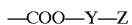 (V)

wherein Y represents alkylene having 1 to 16 carbon atoms in which —$CH_2$— other than that binding to the adjacent —COO— group may be substituted by —S— or —O—, and Z represents hydrogen or alicyclic hydrocarbon having 3 to 20 carbon atoms.

<5> The composition according to any one of <2> to <4>, wherein a weight ratio of the sulfonic acid ester of N-hydroxyimide compound represented by the formula (II) to the total onium salt of the formulae (IIIa) and (IIIb) is 9:1 to 1:9.

<6> The composition according to any one of <1> to <5>, wherein the radiation-sensitive acid generator (B) is contained at 0.3 to 50 parts by weight per 100 parts by weight of the resin (A).

<7> The composition according to any one of <1> to <6>, wherein a nitrogen-containing basic organic compound is further contained as a quencher.

DESCRIPTION OF PREFERRED EMBODIMENTS

The resin component in the present composition contains a structural unit having an acid labile group and the resin component itself is insoluble or poorly soluble in an alkali aqueous solution but becomes soluble in an alkali aqueous solution by the action of an acid. The resin component contains a structural unit derived from p-hydroxystyrene as well as at least one structural unit represented by the above formula (Ia) or (Ib) as the structural unit having an labile group.

Examples of monomers for the structural unit represented by the formula (Ia) or (Ib) include 2-alkyl-2-adamantyl (meth)acrylate and 1-(1-adamantyl)-1-alkylalkyl (meth)acrylate. The use of 2-alkyl-2-adamantyl (meth)acrylate as the monomer for the structural unit is preferable for excellent resolution. Representative examples of such 2-alkyl-2-adamantyl (meth)acrylate include 2-methyl-2-adamantyl acrylate, 2-methyl-2-adamantyl methacrylate, 2-ethyl-2-adamantyl acrylate, 2-ethyl-2-adamantyl methacrylate, 2-n-butyl-2-adamantyl acrylate, and the like. Among these, the use of 2-ethyl-2-adamantyl (meth)acrylate is, in particular, preferable for an excellent balance of sensitivity and heat resistance.

The resin containing the structural unit derived from p-hydroxystyrene and the structural unit derived from 2-ethyl-2-adamantyl (meth)acrylate can be prepared, for example, by the following way: First, p-acetoxystyrene and 2-ethyl-2-adamantyl (meth)acrylate are copolymerized by a conventional method, and then subjected to hydrolysis appropriately to convert a part or all of the acetoxy groups into hydroxyl group, thereby enabling its production.

Copolymerization of hydroxystyrene or acetoxystyrene and 2-ethyl-2-adamantyl (meth)acrylate, and if necessary, further adding another monomer having an acid labile group and/or a monomer other than that can be carried out by a conventional method. For example, a usable method is that a raw material monomer is dissolved in an appropriate solvent, followed by adding a polymerization initiator therein to initiate polymerization and continuing the reaction under heating or cooling. As the solvent, alcohols such as methanol, ethanol, 2-propanol and tert-butanol, aromatic hydrocarbons such as benzene, toluene and xylene, ethers such as tetrahydrofuran, 1,4-dioxane and the like can be used. As the polymerization initiator, azo compounds such as 2,2'-azobis(isobutyronitrile) and dimethyl 2,2'azobis(2-methyl propionate), peroxides such as benzoyl peroxide and tert-butyl peroxide, redox-based initiators such as hydrogen peroxide/ferrous salt and benzoyl peroxide/dimethylaniline, alkylated metal compounds such as butyllithium and triethylaluminum, and the like can be used.

The resin component constituting the present composition essentially contains the structural unit derived from p-hydroxystyrene and the structural unit represented by the formula (Ia) or (Ib), other structural units, for example, structural units derived from styrene, acrylonitrile, methyl methacrylate, methyl acrylate and the like respectively may also be contained. Further, the resin component may contain a structural unit having partially hydrogenated benzene ring, or alkylated or alkoxylated benzene ring as long as alkali solubility is retained.

It is advantageous for the total amount of the structural unit derived from p-hydroxystyrene and the structural unit represented by the formulae (Ia) and (Ib) to occupy 50 mol % or more of the whole resin. As for the ratio of both structural units, the molar ratio of the structural unit derived from p-hydroxystyrene to the structural unit represented by the formulae (Ia) and (Ib) is usually in the range of 99:1 to 60:40, and preferably in the range of 95:5 to 70:30. In addition, the amount of the structural unit represented by the formulae (Ia) and (Ib) is usually 50 mol % or less based on the whole resin component, and preferably 10 to 45 mol %.

The present composition contains a radiation-sensitive acid generator comprising a sulfonic acid ester of N-hydroxyimide compound and an onium salt. A combined use of the sulfonic acid ester of N-hydroxyimide compound and the onium salt in the present composition is effective in making it possible to achieve high sensitivity without decreasing resolution and yield an excellent pattern shape as well as edge roughness.

Examples of the sulfonic acid ester of N-hydroxyimide compound include the compounds represented by the following formula (II):

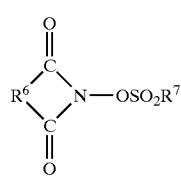

(II)

wherein $R^6$ represents arylene which may be substituted, alkylene which may be substituted, or alkenylene which may be substituted, and $R^7$ represents alkyl which may be substituted or aryl which may be substituted.

The arylene of $R^6$ in the formula (II) may be, for example, phenylene, naphthylene or the like, and the phenylene or naphthylene may be unsubstituted or substituted. Substituent groups of phenylene and naphthylene include alkyl having 1 to 4 carbon atoms, alkoxy having 1 to 4 carbon atoms, halogen such as fluorine, chlorine, bromine and iodine, nitro, acetylamino and the like. It is preferable for the phenylene to be 1,2-phenylene and for the naphthylene to be 1,2-, 2,3- or 1,8-naphthylene.

The alkylene represented by $R^6$ may have 1 to 6 carbon atoms and may be either unsubstituted or substituted. In addition, the alkylene having 2 or more carbon atoms may be straight chained or branched. Preferable alkylene is, for example, ethylene, propylene or trimethylene. The substituents of the alkylene include halogen such as fluorine, chlorine, bromine and iodine, alkoxy having 1 to 4 carbon atoms and phenyl which is unsubstituted or substituted by a group such as alkyl having 1 to 4 carbon atoms, alkoxy having 1 to 4 carbon atoms, halogen, nitro or acetylamino.

The alkenylene represented by $R^6$ may have 2 to 4 carbon atoms, be either unsubstituted or substituted, and be straight chained or branched. Preferable alkenylene is, for example, vinylene. Substituent groups of the alkenylene include unsubstituted phenyl and phenyl substituted with a group, for example, alkoxy having 1 to 4 carbon atoms, halogen, nitro or acetylamino.

The alkyl of $R^7$ in the formula (II) may have, for example, 1 to 12 carbon atoms, and may be either unsubstituted or substituted. In addition, alkyl having 3 or more carbon atoms may be straight chained, branched or cyclic. Substituents of the alkyl include halogen such as fluorine, chlorine, bromine and iodine, alkoxy having 1 to 4 carbon atoms, oxo, and phenyl which is unsubstituted or substituted with a group such as alkyl having 1 to 4 carbon atoms, halogen, nitro or acetylamino.

The aryl of $R^7$ may be, for example, phenyl or naphthyl, and the phenyl and naphthyl may be unsubstituted or substituted. Substituents of the phenyl or naphthyl include alkyl having 1 to 4 carbon atoms, alkoxy having 1 to 4 carbon atoms, halogen such as fluorine, chlorine, bromine and iodine, nitro, and acetylamino.

The compounds represented by the formula (II) can be prepared by reacting N-hydroxydicarboxyimide with alkylsulfonyl chloride or arylsulfonyl chloride under a basic condition according to the method described by L. Bauer et al., J. Org. Chem. 24, 1293 (1959). The N-hydroxydicarboxyimide can be synthesized, for example, according to the method described by G. F. Jaubert, Ber. Dtsch. Chem. 28, 360 (1985), D. E. Ames et al., J. Chem. Soc., 3518 (1955), or M. A. Stolberg et al., J. Amer. Chem. Soc., 79, 2615 (1957).

Examples of the N-hydroxyimide compounds include the followings:

N-(ethylsulfonyloxy)succinimide,
N-(isopropylsulfonyloxy)succinimide,
N-(butlysulfonyloxy)succinimide,
N-(hexylsulfonyloxy)succinimide,
N-(trifluoromethylsulfonyloxy)succinimide,
N-(chloromethylsulfonyloxy)succinimide,
N-(cyclohexylsulfonyloxy)succinimide,
N-(benzylsulfonyloxy)succinimide,
N-(phenylsulfonyloxy)succinimide,
N-(p- or o-tolylsulfonyloxy)succinimide,
N-(2,5-xylylsulfonyloxy)succinimide,
N-(4-ethylphenylsulfonyloxy)succinimide,
N-(2,4,6-trimethylphenylsulfonyloxy)succinimide,
N-(2,4,6-triisopropylphenylphenylsulfonyloxy)succinimide,
N-(4-methoxyphenylsulfonyloxy)succinimide,
N-(4-chlorophenylsulfonyloxy)succinimide,
N-(2,4,5-trichlorophenylsulfonyloxy)succinimide,
N-(2- or 4-nitrophenylsulfonyloxy)succinimide,
N-(4-methoxy-2-nitrophenylsulfonyloxy)succinimide,
N-(1-naphtylsulfonyloxy)succinimide,
N-(10-canphorsulfonyloxy)succinimide,
N-(trifluoromethylsulfonyloxy)succinimide,
N-(trifluoromethylsulfonyloxy)-5-norbornen-2,3-dicarboxyimide,
N-(trifluoromethylsulfonyloxy)naphtalimide,
N-(10-canphorsulfonyloxy)naphtalimide, and the like.

The onium salt in the present composition includes triphenylsulfonium salt represented by the following formula (IIIa) and diphenyliodonium salt represented by the following formula (IIIb) respectively:

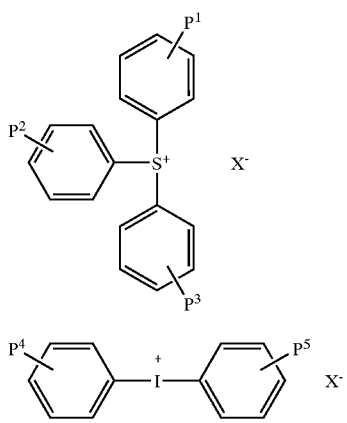

(IIIa)

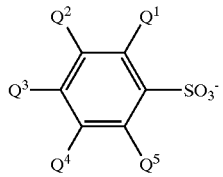

(IIIb)

In the formulae (IIIa) and (IIIb), $P^1$, $P^2$, $P^3$, $P^4$ and $P^5$ each independently represent hydrogen, hydroxyl, alkyl having 1 to 6 carbon atoms or alkoxy having 1 to 6 carbon atoms, and the alkyl and alkoxy may be either straight chained or branched when their carbon atoms are 3 or more. $X^-$ represents a counter ion.

Specific examples of the alkyl having 1 to 6 carbon atoms include methyl, ethyl, propyl, isopropyl, butyl, tert-butyl, pentyl, hexyl and the like, and examples of the alkoxy group having 1 to 6 carbon atoms include methoxy, ethoxy, propoxy, butoxy and the like.

Further, it is preferable that the counter ion $X^-$ of the above onium salt is the compound represented by the following formula (IVa) or (IVb).

$C_pF_{2p+1}SO_3^-$ (IVa)

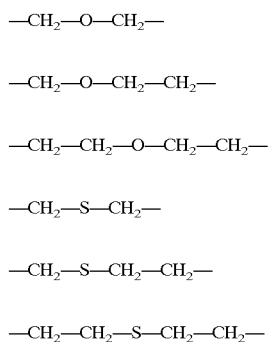

(IVb)

In the formula (IVa), p is an integer of 1 to 8. In the formula (IVb), $Q^1$, $Q^2$, $Q^3$, $Q^4$ and $Q^5$ each independently represent hydrogen, hydroxyl, alkyl having 1 to 12 carbon atoms which may be branched, perfluoroalkyl having 1 to 12 carbon atoms which may be branched, alkoxy having 1 to 12 carbon atoms, electron-withdrawing group, or a group represented by the following formula (V):

—COO—Y—Z (V)

wherein Y represents alkylene having 1 to 16 carbon atoms in which —$CH_2$— other than that binding to the adjacent —COO— group may be substituted by —S— or —O—, Z represents hydrogen or alicyclic hydrocarbon having 3 to 20 carbon atoms.

Examples of the perfluoroalkyl having 1 to 12 carbon atoms includes trifluoromethyl, perfluorobutyl, perfluorooctyl and the like, examples of the alkyl having 1 to 12 carbon atoms includes methyl, ethyl, propyl, isopropyl, butyl, pentyl, hexyl, cyclohexyl, octyl and the like, examples of the alkoxy group having 1 to 12 carbon atoms includes methoxy, ethoxy, propoxy, butoxy and the like, and examples of the electron-withdrawing group includes halogen such as fluoro, chloro and bromo, cyano, nitro, carbonyl, sulfonyl and the like, and preferably nitro among them.

Further, when a plurality of groups represented by the formula (V) are present in the formula (IVb), they may be the same or different from one another.

Examples of the alkylene having 1 to 16 carbon atoms in the formula (V) include methylene, ethylene, propan-1,3-diyl, methylethylene, propan-2,2-diyl, butan-1,4-diyl, 2-methylpropan-1,2-diyl, pentan-1,5-diyl, hexan-1,6-diyl, octan-1,8-diyl, decan-1,10-diyl, dodecan-1,10-diyl, hexadecan-1,16-diyl and the like.

Examples of the alkylene group having 1 to 16 carbon atoms in which —$CH_2$— other than that binding to the adjacent —COO— group is substituted by —S— or —O— following groups:

—$CH_2$—O—$CH_2$—

—$CH_2$—O—$CH_2$—$CH_2$—

—$CH_2$—$CH_2$—O—$CH_2$—$CH_2$—

—$CH_2$—S—$CH_2$—

—$CH_2$—S—$CH_2$—$CH_2$—

—$CH_2$—$CH_2$—S—$CH_2$—$CH_2$—

Examples of the alicyclic hydrocarbon having 3 to 20 carbon atoms include following groups:

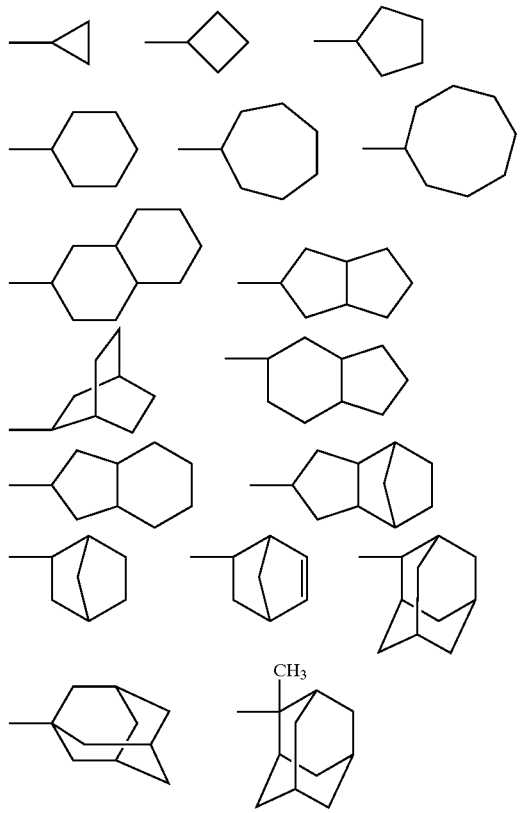

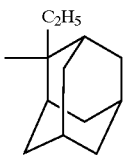

In the above, preferable groups include cyclohexyl, 2-norbornyl, 1-adamantyl and 2-adamantyl.

The triphenylsulfonium salt of the formula (IIIa) can be used as it is when it is commercially available, and also can be produced according to conventional methods.

The methods for producing triphenylsulfonium salt produced may be, for example, a method reacting corresponding triphenylsulfonium bromide with silver salt of sulfonic acid having the same structure of anion part of the intended sulfonium salt; a method reacting corresponding diphenylsulfoxide, aryl compound (i.e. diphenyl ether, diphenylsufoxide, and the like) and perfluoroalkanesulfonic acid in the presence of trifluoroacetic anhydride according to the method described in Chem. Pharm. Bull., Vol. 29, 3753 (1981); a method reacting corresponding aryl Grignard reagent with thionyl chloride, reacting the product with triorganosilyl halide to obtain triarylsulfonium halide, and then reacting the triarylsulfonium halide with silver salt of sulfonic acid having the same structure of anion part of the intended sulfonate according to the method described in JP-H08-311018-A; and the like. The sulfonium salt in which $P^1$, $P^2$ or $P^3$ in the formula (IIIa) is hydroxy, can be produced by reacting triphenylsulfonium salt having tert-butoxy on its benzene ring with sulfonic acid having the same structure of anion part of the intended sulfonium salt to eliminate the tert-butyl according to the method described in JP-H08-311018-A.

The methods for producing diphenyliodonium salt of the formula (IIIb) may be, for example, a method reacting iodosyl sulfate with corresponding aryl compound, and then adding thereto corresponding sulfonic acid having the same structure of anion part of the intended diphenyliodonium salt according to a method described in J. Am. Chem. Soc., vol. 81, 342 (1959); a method adding iodine and trifluoro acetic acid to a mixture of acetic anhydride and fuming nitric acid, then reacting the reaction mixture and corresponding aryl compound, and then adding thereto corresponding sulfonic acid having the same structure of anion part of the intended diphenyliodonium salt; a method reacting a mixture of corresponding aryl compound, acetic anhydride and potassium iodate by adding drop-wise concentrated sulfuric acid thereto, and then adding thereto corresponding sulfonic acid having the same structure of anion part of the intended diphenyliodonium salt according to a method described in JP-H09-179302-A; and the like.

Specific examples of the triphenylsulfonium salt of the formula (IIIa) and the diphenyliodonium salt of the formula (IIIb) include as follows:

triphenylsulfonium trifluoromethanesulfonate,
triphenylsulfonium perfluorobutanesulfonate,
triphenylsulfonium perfluorooctanesulfonate,
4-methylphenyldiphenylsulfonium trifluoromethanesulfonate,
4-methylphenyldiphenylsulfonium perfluorobutanesulfonate,
4-methylphenyldiphenylsulfonium perfluorooctanesulfonate,
4-hydroxyphenyldiphenylsulfonium perfluorobutanesulfonate,
4-hydroxyphenyldiphenylsulfonium perfluorooctanesulfonate,
4-methoxyphenyldiphenylsulfonium perfluorobutanesulfonate,
4-methoxyphenyldiphenylsulfonium perfluorooctanesulfonate,
tris(4-methylphenyl)sulfonium perfluorobutanesulfonate,
tris(4-methylphenyl)sulfonium perfluorooctanesulfonate,
tris(4-methoxyphenyl)sulfonium perfluorobutanesulfonate,
tris(4-methoxyphenyl)sulfonium perfluorooctanesulfonate,
2,4,6-trimethylphenyldiphenylsulfonium trifluoromethanesulfonate,
4-tert-butylphenyldiphenylsulfonium trifluoromethanesulfonate,
diphenyliodonium trifluoromethanesulfonate,
diphenyliodonium perfluorobutanesulfonate,
4-methoxyphenylphenyliodonium trifluoromethanesulfonate,
di(4-methoxyphenyl)iodonium perfluorooctanesulfonate,
di(4-tert-butylphenyl)iodonium trifluoromethanesulfonate,
di(4-tert-butylphenyl)iodonium perfluorooctanesulfonate,
triphenylsulfonium benzenesulfonate,
triphenylsulfonium p-toluenesulfonate,
triphenylsulfonium triisopropylbenzenesulfonate,
triphenylsulfonium 2-fluorobenzenesulfonate,
triphenylsulfonium 4-fluorobenzenesulfonate,
triphenylsulfonium 2,4-difluorobenzenesulfonate,
triphenylsulfonium 4-(n-butyl)benzenesulfonate,
triphenylsulfonium 4-(n-octyl)benzenesulfonate,
triphenylsulfonium 4-(n-dodecyl)benzenesulfonate,
4-methylphenyldiphenylsulfonium benzenesulfonate,
4-methylphenyldiphenylsulfonium p-toluenesulfonate,
4-methylphenyldiphenylsulfonium triisopropylbenzenesulfonate,
4-methylphenyldiphenylsulfonium 2-fluorobenzenesulfonate,
4-methylphenyldiphenylsulfonium 4-fluorobenzenesulfonate,
4-methylphenyldiphenylsulfonium 2,4-difluorobenzenesulfonate,
4-methylphenyldiphenylsulfonium 4-(n-butyl)benzenesulfonate,
4-methylphenyldiphenylsulfonium 2,4,6-triisopropyl-3-nitrobenzenesulfonate,
4-methylphenyldiphenylsulfonium 4-(n-octyl)benzenesulfonate,
4-methylphenyldiphenylsulfonium 4-(n-dodecyl)benzenesulfonate,
tris(4-methylphenyl)sulfonium benzenesulfonate,
tris(4-methylphenyl)sulfonium p-toluenesulfonate,
tris(4-methylphenyl)sulfonium triisopropylbenzenesulfonate,
tris(4-methylphenyl)sulfonium 2-fluorobenzenesulfonate,
tris(4-methylphenyl)sulfonium 4-fluorobenzenesulfonate, tris(4-methylphenyl)sulfonium 2,4-difluorobenzenesulfonate,
tris(4-methylphenyl)sulfonium 4-(n-butyl)benzenesulfonate,
tris(4-methylphenyl)sulfonium 4-(n-octyl)benzenesulfonate,
tris(4-methylphenyl)sulfonium 4-(n-dodecyl)benzenesulfonate,
4-hydroxyphenyldiphenylsulfonium benzenesulfonate,
4-methoxyphenyldiphenylsulfonium p-toluenesulfonate,
4-methoxyphenyldiphenylsulfonium triisopropylbenzenesulfonate,
4-methoxyphenyldiphenylsulfonium 2-fluorobenzenesulfonate,
4-methoxyphenyldiphenylsulfonium 4-fluorobenzenesulfonate,
4-methoxyphenyldiphenylsulfonium 2,4-difluorobenzenesulfonate,
4-methoxyphenyldiphenylsulfonium 4-(n-butyl)benzenesulfonate,
4-methoxyphenyldiphenylsulfonium 4-(n-octyl)benzenesulfonate,
4-methoxyphenyldiphenylsulfonium 4-(n-dodecyl)benzenesulfonate,
4-methoxyphenyldiphenylsulfonium benzenesulfonate,
4-methoxyphenyldiphenylsulfonium benzenesulfonate,
tris(4-methoxyphenyl)sulfonium benzenesulfonate,
tris(4-methoxyphenyl)sulfonium p-toluenesulfonate,
tris(4-methoxyphenyl)sulfonium triisopropylbenzenesulfonate,
tris(4-methoxyphenyl)sulfonium 2-fluorobenzenesulfonate,
tris(4-methoxyphenyl)sulfonium 4-fluorobenzenesulfonate,
tris(4-methoxyphenyl)sulfonium 2,4-difluorobenzenesulfonate,
tris(4-methoxyphenyl)sulfonium 4-(n-butyl)benzenesulfonate,
tris(4-methoxyphenyl)sulfonium 4-(n-octyl)benzenesulfonate,
tris(4-methoxyphenyl)sulfonium 4-(n-dodecyl)benzenesulfonate,
triphenylsulfonium 1-(methoxycarbonyl)benzenesulfonate,
triphenylsulfonium 4-(n-pentyloxycarbonyl)benzenesulfonate,
triphenylsulfonium 4-(n-octyloxycarbonyl)benzenesulfonate,
triphenylsulfonium 3,5-bis(methoxycarbonyl)benzenesulfonate,
triphenylsulfonium 3,5-bis(ethoxycarbonyl)benzenesulfonate,
triphenylsulfonium 3,5-bis(n-octyloxycarbonyl)benzenesulfonate,
triphenylsulfonium 3,5-bis(n-hexadecyloxycarbonyl)benzenesulfonate,
4-methylphenyldiphenylsulfonium 3,5-bis(methoxycarbonyl)benzenesulfonate,
4-methylphenyldiphenylsulfonium 3,5-bis(n-octyloxycarbonyl)benzenesulfonate,
4-methylphenyldiphenylsulfonium 3,5-bis(n-hexadecyloxycarbonyl)benzenesulfonate,
4-methylphenyldiphenylsulfonium 4-(cyclopentyloxycarbonyl)benzenesulfonate,
4-methylphenyldiphenylsulfonium 4-(cyclohexylmethyloxycarbonyl)benzenesulfonate,
4-methylphenyldiphenylsulfonium 4-(2-cyclohexylethyloxycarbonyl)benzenesulfonate,
4-methylphenyldiphenylsulfonium 4-(2-norbornylmethyloxycarbonyl)benzenesulfonate,
4-methylphenyldiphenylsulfonium 4-(1-adamantylmethyloxycarbonyl)benzenesulfonate,
4-methylphenyldiphenylsulfonium 4-(2-adamantylmethyloxycarbonyl)benzenesulfonate,
4-methylphenyldiphenylsulfonium 2,4-dichloro-5-(2-cyclohexylethyloxycarbonyl)benzenesulfonate,
4-methylphenyldiphenylsulfonium 2,6-dichloro-5-(2-cyclohexylethyloxycarbonyl)benzenesulfonate,
4-methylphenyldiphenylsulfonium 3-bromo-6-(cyclohexylmethyloxycarbonyl)benzenesulfonate,
4-methylphenyldiphenylsulfonium 2,6-dinitro-4-(2-cyclohexylethyloxycarbonyl)benzenesulfonate,
4-methylphenyldiphenylsulfonium 4-(10-cyclohexyl-3,6-dioxadecyloxycarbonyl)benzenesulfonate,
4-methylphenyldiphenylsulfonium 4-(10-cyclohexyl-3,6-dithiadecyloxycarbonyl)benzenesulfonate,
4-methylphenyldiphenylsulfonium 3,5-bis(2-cyclohexylethyloxycarbonyl)benzenesulfonate,
4-methylphenyldiphenylsulfonium 3,4-bis(2-cyclohexylethyloxycarbonyl)benzenesulfonate,
4-methylphenyldiphenylsulfonium 3,5-bis(2-norbornylmethyloxycarbonyl)benzenesulfonate,
4-methylphenyldiphenylsulfonium 3,5-bis(1-adamantylmethyloxycarbonyl)benzenesulfonate,
4-methylphenyldiphenylsulfonium 3,5-bis(2-adamantylmethyloxycarbonyl)benzenesulfonate,
4-methylphenyldiphenylsulfonium 2,4,6-tris(2-cyclohexylethyloxycarbonyl)benzenesulfonate,
4-methylphenyldiphenylsulfonium 2,4,6-tris(2-norbornylmethyloxycarbonyl)benzenesulfonate,
4-methylphenyldiphenylsulfonium 2,4,6-tris(1-adamantylmethyloxycarbonyl)benzenesulfonate,
diphenyliodonium p-toluenesulfonate,
di(4-methoxyphenyl)iodonium p-toluenesulfonate,
di(4-tert-butylphenyl)iodonium benzenesulfonate,
di(4-tert-butylphenyl)iodonium p-toluenesulfonate,
di(4-tert-butylphenyl)iodonium triisopropylbenzenesulfonate,
di(4-tert-butylphenyl)iodonium 2,4,6-triisopropyl-3-nitrobenzenesulfonate,
di(4-tert-butylphenyl)iodonium 2-fluorobenzenesulfonate, di (4-tert-butylphenyl)iodonium 4-fluorobenzenesulfonate, di(4-tert-butylphenyl)iodonium 2,4-difluorobenzenesulfonate, di(4-tert-butylphenyl)iodonium 4-(n-butyl)benzenesulfonate, di(4-tert-butylphenyl)iodonium 4-(n-octyl)benzenesulfonate, di(4-tert-butylphenyl)iodonium 4-(n-dodecyl)benzenesulfonate, diphenyliodonium 4-(n-octyloxycarbonyl)benzenesulfonate, diphenyliodonium 4-(2-cyclohexylethyloxycarbonyl)benzenesulfonate, di(4-tert-butylphenyl)iodonium 4-(2-cyclohexylethyloxycarbonyl)benzenesulfonate, di(4-tert-butylphenyl)iodonium 4-(2-norbornylmethyloxycarbonyl)benzenesulfonate, di(4-tert-butylphenyl)iodonium 4-(1-adamantylmethyloxycarbonyl)benzenesulfonate, di(4-tert-butylphenyl)iodonium 4-(2-adamantylmethyloxycarbonyl)benzenesulfonate, di(4-tert-butylphenyl)iodonium 3,5-bis(2-cyclohexylethyloxycarbonyl)benzenesulfonate, di(4-tert-butylphenyl)iodonium 3,5-bis(2-norbornylmethyloxycarbonyl)benzenesulfonate, di(4-tert-butylphenyl)iodonium 3,5-bis(1-adamantylmethyloxycarbonyl)benzenesulfonate, di(4-tert-butylphenyl)iodonium 3,5-bis(2-adamantylmethyloxycarbonyl)benzenesulfonate.

A basic organic compound may preferably be contained in the present composition, because performance deterioration due to the deactivation of an acid associated with leaving after exposure can be reduced. In such case, the basic organic compound is also called a quencher. Examples of the basic compounds include nitrogen-containing basic organic compound, such as amines. Specific examples of the nitrogen-containing basic organic compound include the ones represented by the following formulae:

[3]

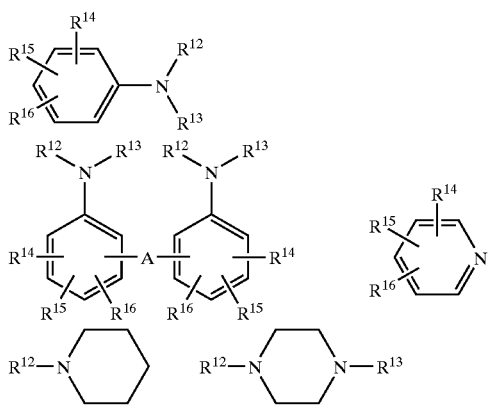

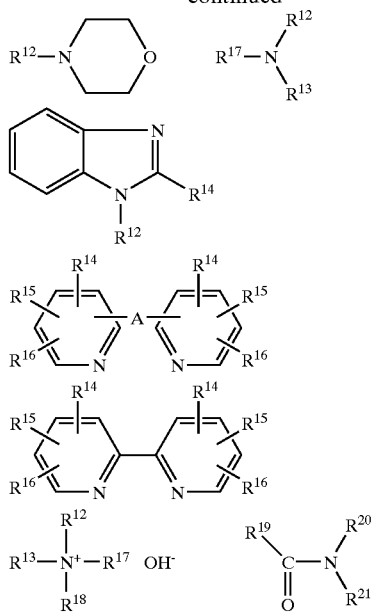

In the formulae, $R^{12}$, $R^{13}$ and $R^{18}$ each independently represent hydrogen, alkyl, cycloalkyl or aryl. The alkyl preferably has about 1 to 6 carbon atoms, the cycloalkyl preferably has about 5 to 10 carbon atoms, and the aryl preferably has about 6 to 10 carbon atoms. Furthermore, at least one hydrogen on the alkyl, cycloalkyl or aryl may each independently be substituted with hydroxyl, amino, or alkoxy having 1 to 6 carbon atoms. At least one hydrogen on the amino group each independently may be substituted with alkyl group having 1 to 4 carbon atoms.

$R^{14}$, $R^{15}$ and $R^{16}$ each independently represent hydrogen, alkyl cycloalkyl, aryl or alkoxy. The alkyl preferably has about 1 to 6 carbon atoms, the cycloalkyl preferably has about 5 to 10 carbon atoms, the aryl preferably has about 6 to 10 carbon atoms, and the alkoxy preferably has about 1 to 6 carbon atoms. Furthermore, at least one hydrogen on the alkyl, cycloalkyl, aryl or alkoxy each independently may be substituted with hydroxyl, amino, or alkoxy having 1 to 6 carbon atoms. At least one hydrogen on the amino may be substituted with alkyl having 1 to 4 carbon atoms.

$R^{17}$ represents alkyl or cycloalkyl. The alkyl preferably has about 1 to 6 carbon atoms, and the cycloalkyl preferably has about 5 to 10 carbon atoms. Furthermore, at least one hydrogen on the alkyl or cycloalkyl may each independently be substituted with hydroxyl, amino, or alkoxy having 1 to 6 carbon atoms. At least one hydrogen on the amino may be substituted with alkyl having 1 to 4 carbon atoms.

However, none of $R^{12}$, $R^{13}$, $R^{17}$ and $R^{18}$ in the compound represented by the above formula [3] is hydrogen.

A represents alkylene, carbonyl, imino, sulfide or disulfide. The alkylene preferably has about 2 to 6 carbon atoms.

Moreover, among $R^{12}$-$R^{18}$, in regard to those which can be straight-chained or branched, either of these may be permitted.

$R^{19}$, $R^{20}$ and $R^{21}$ each independently represent hydrogen, alkyl having 1 to 6 carbon atoms, aminoalkyl having 1 to 6 carbon atoms, hydroxyalkyl having 1 to 6 carbon atoms or substituted or unsubstituted aryl having 6 to 20 carbon atoms, or $R^{19}$ and $R^{20}$ bond to form alicyclic hydrocarbon ring together with adjacent carbon atom.

Examples of such compounds include hexylamine, heptylamine, octylamine, nonylamine, decylamine, aniline, 2-, 3- or 4-methylaniline, 4-nitroaniline, 1- or 2-naphtylamine, ethylenediamine, tetramethylenediamine, hexamethylenediamine, 4,4'-diamino-1,2-diphenylethane, 4,4'-diamino-3,3'-dimethyldiphenylmethane, 4,4'-diamino-3,3'-diethyldiphenylmethane, dibutylamine, dipentylamine, dihexylamine, diheptylamine, dibutylamine, dinonylamine, didecylamine, N-methylaniline, piperidine, diphenylamine, triethylamine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethydipentylamine, ethyldihexylamine, ethydiheptylamine, ethyldioctylamine, ethyldinonylamine, ethyldidecylamine, dicyclohexylmethylamine, tris [2-(2-methoxyethoxy) ethyl]amine, trilsopropanolamine, N,N-dimethylaniline, 2,6-isopropylaniline, imidazole, pyridine, 4-methylpyridine, 4-methyimidazole, bipyridine, 2,2'-dipyridylaamine, di-2-pyridyl ketone, 1,2-di(2-pyridyl)ethane, 1,2-di(4-pyridyl)ethane, 1,3-di(4-pyridyl)propane, 1,2-bis(2-pyridyl)ethylene, 1,2-bis(4-pyridyl)ethylene, 1,2-bis(2-pyridyloxy)ethane, 4,4'-dipyridyl sulfide, 4,4'-dipyridyl disulfide, 1,2-bis(4-pyridyl)ethylene, 2,2'-dipicolylamine, 3,3'-dipicolylamine, tetramethylammonium hydroxide, tetraisopropylammonium hydroxide, tetrabutylammonium hydroxide, tetra-n-hexylammonium hydroxide, tetra-n-octylammonium hydroxide, phenyltrimethylammonium hydroxide, 3-trifluoromethylphenyltrimethylammonium hydroxide, (2-hydroxyethyl)trimethylammonium hydroxide (so-called "choline"), N-methylpyrrolidone, dimethylimidazole, and the like.

Furthermore, hindered amine compounds having piperidine skeleton as disclosed in JP-A-H11-52575 can be used as quencher.

The present composition contains a radiation-sensitive acid generator preferably in a range of 0.3 to 50 parts by weight per 100 parts by weight of resin component. When a combination of a compound shown by the formula (II) and at least one sulfonium salt selected from the formula (IIIa) or (IIIb) is used as a radiation-sensitive acid generator, both compounds are used preferably at a weight ratio of 9:1 to 1:9, more preferably at a weight ratio of 8:2 to 2:8. When a basic compound as a quencher the compound is contained preferably at a range of 0.001 to 5 parts by weight, more preferably at a range of 0.01 to 1 part by weight per 100 parts by weight of a resin in the present composition.

The present composition may contain, as required, small amounts of various additives such as sensitizers, dissolution inhibitors, other resins, surfactants, stabilizers, dyes and the like as long as the effect of the present invention is not prevented.

The present composition is usually in the form of a resist liquid composition in which the aforementioned ingredients are dissolved in a solvent, and the resist liquid composition is to be applied onto a substrate such as a silicon wafer by a conventional process such as spin coating. The solvent used here is sufficient to dissolve the aforementioned ingredients, have an adequate drying rate, and give a uniform and smooth coat after evaporation of the solvent and, hence, solvents generally used in the art can be used. In the present invention, the total solid content means total content exclusive of solvents.

Examples thereof include glycol ether esters such as ethylcellosolve acetate, methylcellosolve acetate and propylene glycol monomethyl ether acetate; esters such as ethyl lactate, butyl lactate, amyl lactate and ethyl pyruvate and the like; ketones such as acetone, methyl isobutyl ketone, 2-heptanone and cyclohexanone; cyclic esters such as γ-butyrolactone, and the like. These solvents can be used each alone or in combination of two or more.

A resist film applied onto the substrate and then dried is subjected to exposure for patterning, then heat-treated for facilitating a deblocking reaction, and thereafter developed with an alkali developer. The alkali developer used here may be any one of various alkaline aqueous solutions used in the art, and generally, an aqueous solution of tetramethylammonium hydroxide or (2-hydroxyethyl)trimethylammonium hydroxide (commonly known as "choline") is often used.

It should be construed that embodiments disclosed here are examples in all aspects and not restrictive. It is intended that the scope of the present invention is determined not by the above descriptions but by appended Claims, and includes all variations of the equivalent meanings and ranges to the Claims.

The present invention will be further illustrated by examples. However, the present invention is not limited to them at all.

In the examples, % and parts showing content and use amount are by weight unless otherwise stated. Weight-average molecular weight (Mw) and degree of polydispersion (Mw/Mn) are values measured by gel permeation chromatography using polystyrene as a standard.

SYNTHETIC EXAMPLE 1

Synthesis of 2-ethyl-2-adamantyl methacrylate/p-acetoxystyrene (20:80) copolymer Into a flask were added 39.7 g (0.16 mol) of 2-ethyl-2-adamantyl methacrylate, 103.8 g (0.64 mol) of p-acetoxystyrene and 265 g of isopropanol, followed by heating up to 75° C. under an atmosphere of nitrogen. To this solution was dropped a solution of 11.05 g (0.048 mol) of dimethyl 2,2'-azobis(2-methylpropionate) dissolved in 22.11 g of isopropanol. The solution was heated for about 0.3 hour at 75° C. and further refluxed for about 12 hours. After diluting with acetone, the reaction mixture was poured into a large amount of methanol to precipitate the polymerized product, which was separated by filtration. The weight of the obtained copolymer of 2-ethyl-2-adamantyl methacrylate and p-acetoxystyrene was 250 g (note: wet weight of cake containing methanol).

SYNTHETIC EXAMPLE 2

Synthesis of 2-ethyl-2-adamantyl methacrylate/p-hydroxystyrene (20:80) copolymer Into a flask were added 250 g of the 2-ethyl-2-adamantyl methacrylate and p-acetoxystyrene copolymer (20:80) obtained in Synthetic Example 1, 10.3 g (0.084 mol) of 4-dimethylaminopyridine and 202 g of methanol, followed by refluxing for 20 hours. After cooling, the reaction mixture was neutralized with 7.6 g (0.126 mol) of glacial acetic acid, and the product was precipitated by pouring the reaction mixture into a large amount of water. After the precipitated polymerized product was separated by filtration and redissolved in acetone, the procedure of precipitation by pouring polymer solution into a large amount of water was repeated for a total of 3 times to purify the polymerized product. The obtained copolymer of 2-ethyl-2-adamantyl methacrylate and p-hydroxystyrene was 95.9 g. This copolymer had a weight-average molecular weight of about 8,600 with dispersion of 1.65 (GPC method; on polystyrene basis), and its copolymerization ratio was determined to be about 20:80 by a nuclear magnetic resonance ($^{13}$C-NMR) analyzer. This resin was referred to as Resin A1.

SYNTHETIC EXAMPLE 3
Synthesis of 2-ethyl-2-adamantyl methacrylate and p-acetoxystyrene copolymer (30:70)

Into a flask were added 59.6 g (0.24 mol) of 2-ethyl-2-adamantyl methacrylate, 90.8 g (0.56 mol) of p-acetoxystyrene and 279 g of isopropanol, followed by heating up to 75° C. under an atmosphere of nitrogen. To the solution was dropped a solution of 11.05 g (0.048 mol) of dimethyl 2,2'azobis(2-methylpropionate) dissolved in 22.11 g of isopropanol. After the solution was heated for about 0.3 hour at 75 degrees C and further refluxed for about 12 hours, the reaction mixture was diluted with acetone and poured into a large amount of methanol to precipitate the polymerized product, which was separated by filtration. The weight of the obtained copolymer of 2-ethyl-2-adamantyl methacrylate and p-acetoxystyrene was 250 g (note; wet weight of cake containing methanol).

SYNTHETIC EXAMPLE 4
Synthesis of 2-ethyl-2-adamantyl methacrylate and p-hydroxystyrene copolymer (30:70)

Into a flask were added 250 g of the 2-ethyl-2-adamantyl methacrylate and p-acetoxystyrene copolymer (30:70) obtained in Synthetic Example 3, 10.8 g (0.088 mol) of 4-dimethylamino),ridine and 239 g of methanol, followed by refluxing for 20 hours. After cooling, the reaction mixture was neutralized with 8.0 g (0.133 mol) of glacial acetic acid, and the product was precipitated by pouring the reaction mixture into a large amount of water. After the precipitated polymerized product was redissolved in acetone, the procedure of precipitation by pouring polymer solution into water was repeated for a total of 3 times to purify the polymerized product. The obtained crystalline copolymer of 2-ethyl-2-adamantyl methacrylate and p-hydroxystyrene was 102.8 g. This copolymer had a weight-average molecular weight of about 8,200 with dispersion of 1.68 (GPC method; on polystyrene basis), and its copolymerization ratio was determined to be about 30:70 by a nuclear magnetic resonance ($^{13}$C-NMR) analyzer. This resin was referred to as Resin A2.

Examples 1 to 6 and Comparative Examples 1 to 4

Each of the following compositions was mixed together, dissolved, and further filtrated through a fluorine resin filter having pore diameter of 0.2 μm, to prepare resist solution:

| Resin | Resin A1 (solid amount) | 5.0 parts |
|---|---|---|
|  | Resin A2 (solid amount) | 5.0 parts |
| Acid generator | Kind and amount shown in Table 1 |  |
| Quencher | 2,6-Diisopropylaniline | 0.055 part |
| Solvent | Propyleneglycol monomethyl ether acetate | 232.0 parts* |
|  | Propyleneglycol monomethyl ether | 58.0 parts |

*Solvent amount includes carried from resin solution.

It should be noted that symbols shown in the "acid generator" column of Table 1 refer to the following compounds, respectively:

B1: N-(Ethylsulfonyloxy)succinimide
B1: N-(Butylsulfonyloxy)succinimide
B1: N-(Isopropylsulfonyloxy)succinimide
C1: Triphenylsulfonium triisopropylbenzenesulfonate
C2: Di(4-tert-butylphenyl)iodonium 2,4,6-triisopropyl-3-nitorobenzenesulfonate
C3: 4-Methylphenyldiphenylsulfonium 3,5-bis (2-cyclohexylethyloxycarbonyl)benzenesulfonate
C4: 4-Methylphenyldiphenylsulfonium 3,5-bis(1-adamantylmethyloxycarbonyl)benzenesulfonate Each resist solution was spin-coated on a silicone wafer treated with hexamethyldisilazane (HMDS), and then pre-baked on a proximity hot plate under a condition of 125° C. for 60 seconds to form resist film having a thickness of 0.10 μm. The wafer on which the resist film was formed as described above was exposed to radiation using an electron beam direct writing system (HL-800D, 50 keV; manufactured by Hitachi Ltd.). Then, PEB was carried out on a hot plate under a condition of 110° C. for 60 seconds, and further paddle development was conducted for 60 seconds using an aqueous solution of 2.38% tetramethylammonium hydroxide. The pattern profile after the development was observed by a scanning electron microscope, and sensitivity, resolution and shape were examined. The results are shown in Table 1.

Effective sensitivity: It is expressed as the amount of exposure that the line pattern (light-shielding layer) and the space pattern (light-transmnitting layer) become 1:1 after exposure through 0.1 μm line and space pattern.

Resolution: It is expressed as the minimum size of space pattern which gave the space pattern split by the line pattern at the exposure amount of the effective sensitivity.

Shape: Shape of cross section of the pattern walls was observed by a scanning electron microscope, and when the shape is rectangular, judge is O (good), when the shape is reverse tapered, judge is X (poor).

Smoothness of pattern wall surface: A pattern wall surface of dense line pattern was observed by a scanning electron microscope, and when line edge roughness is observed, judge is "X" (poor), and when it is not observed, judge is "O" (good).

TABLE 1

| Example No. | Acid generator and its amount | Effective sensitivity | Resolution | Shape | Smoothness of pattern profile |
|---|---|---|---|---|---|
| Example 1 | B1: 1.0 part C1: 1.0 part | 13.5 | 0.07 | O | O |
| Example 2 | B2: 1.0 part C1: 1.0 part | 7.0 | 0.06 | O | O |
| Example 3 | B3: 1.0 part C1: 1.0 part | 12.8 | 0.07 | O | O |
| Example 4 | B2: 1.0 part C2: 1.0 part | 12.4 | 0.07 | O | O |
| Example 5 | B2: 1.0 part C3: 1.0 part | 9.0 | 0.06 | O | O |
| Example 6 | B2: 1.0 part C4: 1.0 part | 11.4 | 0.07 | O | O |
| Comparative Example 1 | B1: 1.0 part — | 21.0 | 0.10 | X | O |
| Comparative Example 2 | — C1: 1.0 part | 31.0 | 0.07 | X | X |
| Comparative Example 3 | — C3: 1.36 part | 21.0 | 0.07 | X | X |
| Comparative Example 4 | — C4: 1.35 part | 33.0 | 0.07 | X | X |

A chemical amplification type positive resist composition of the present invention has a high sensitivity and high resolution and is improved in reducing shape irregularity such as rectangularity of pattern and can provide an excellent resist pattern, in particular, with respect to smoothness of pattern profile. A variety of resist performances such as coatability, film residual rate, heat resistance and the like are also excellent. Accordingly, the composition is suitable for lithography with electron beam, EUV and the like, thereby being able to form a fine resist pattern with high precision.

What is claimed is:

1. A chemical amplification type positive resist composition comprising:

(A) a resin which itself is insoluble or poorly soluble in an alkali aqueous solution but becomes soluble in an alkali aqueous solution by the action of an acid, and which contains a structural unit derived from p-hydroxystyrene and a structural unit represented by the formula (Ia) or (Ib)

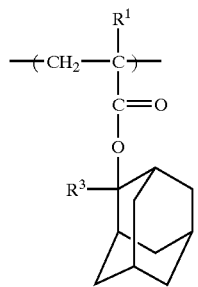
(Ia)

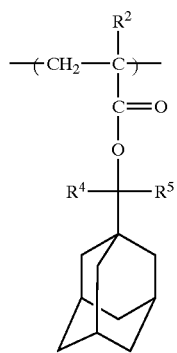
(Ib)

wherein $R^1$ and $R^2$ each independently represents hydrogen or methyl, and $R^3$ to $R^5$ each independently represents alkyl having 1 to 8 carbon atoms; and (B) radiation-sensitive acid generator comprising sulfonic acid ester of N-hydroxyimide compound; and onium salt.

2. The composition according to claim 1, wherein said sulfonic acid ester of N-hydroxyimide compound is a compound represented by the formula (II):

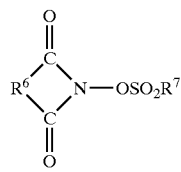
(II)

wherein $R^6$ represents arylene which may be substituted, alkylene which may be substituted or alkenylene which may be substituted, and $R^7$ represents alkyl which may be substituted or aryl which may be substituted.

3. The composition according to claim 1, wherein said onium salt is a salt represented by the formula (IIIa) or (IIIb):

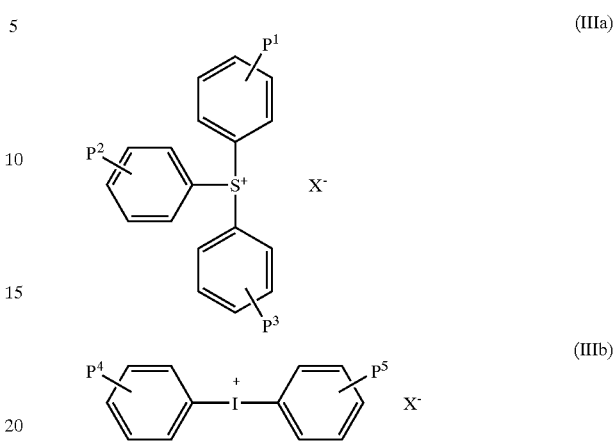
(IIIa)

(IIIb)

wherein $P^1$ to $P^5$ each independently represents hydrogen, hydroxyl, alkyl having 1 to 6 carbon atoms or alkoxy having 1 to 6 carbon atoms, $X^-$ represents a counter ion.

4. The composition according to claim 3, wherein said counter ion $X^-$ is an ion represented by the following formula (IVa) or (IVb):

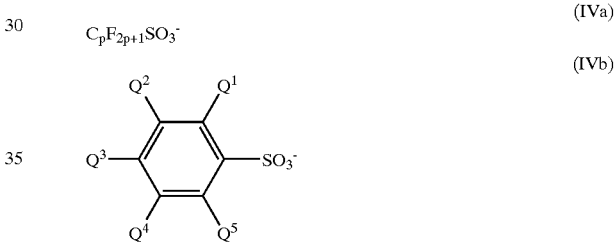
(IVa)

(IVb)

wherein p represents an integer of 1 to 8, and $Q^1$ to $Q^5$ each independently represents hydrogen, hydroxyl, alkyl having 1 to 12 carbon atoms, perfluoroalkyl having 1 to 12 carbon atoms, alkoxy having 1 to 12 carbon atoms, electron-withdrawing group, or a group represented by the formula (V):

—COO—Y—Z (V)

wherein Y represents alkylene having 1 to 16 carbon atoms in which —$CH_2$— other than that binding to the adjacent —COO— group may be substituted by —S— or —O—, and Z represents hydrogen or alicyclic hydrocarbon having 3 to 20 carbon atoms.

5. The composition according to claim 3, wherein a weight ratio of the sulfonic acid ester of N-hydroxyimide compound represented by the formula (II) to the total onium salt of the formula (IIIa) and the formula (IIIb) is 9:1 to 1:9.

6. The composition according to claim 1, wherein the radiation-sensitive acid generator (B) is contained at 0.3 to 50 parts by weight per 100 parts by weight of the resin (A).

7. The composition according to claim 1, wherein a nitrogen-containing basic organic compound is further contained as a quencher.

* * * * *